United States Patent
Itou

(10) Patent No.: US 9,189,005 B2
(45) Date of Patent: Nov. 17, 2015

(54) TRANSMISSION POWER CONTROL CIRCUIT AND TRANSMISSION DEVICE, TRANSMISSION POWER CONTROL METHOD, PROGRAM

(75) Inventor: Masatoshi Itou, Tokyo (JP)

(73) Assignee: NEC Corporation, Tokyo (JP)

( * ) Notice: Subject to any disclaimer, the term of this patent is extended or adjusted under 35 U.S.C. 154(b) by 259 days.

(21) Appl. No.: 13/885,880

(22) PCT Filed: Nov. 24, 2011

(86) PCT No.: PCT/JP2011/077082
§ 371 (c)(1),
(2), (4) Date: May 16, 2013

(87) PCT Pub. No.: WO2012/070627
PCT Pub. Date: May 31, 2012

(65) Prior Publication Data
US 2013/0237276 A1 Sep. 12, 2013

(51) Int. Cl.
*H04W 52/04* (2009.01)
*G05F 3/02* (2006.01)
*H03G 3/30* (2006.01)
*H04W 52/52* (2009.01)

(52) U.S. Cl.
CPC ............... *G05F 3/02* (2013.01); *H03G 3/3042* (2013.01); *H04W 52/04* (2013.01); *H04W 52/52* (2013.01); *Y02B 60/50* (2013.01)

(58) Field of Classification Search
CPC ....... G05F 3/02; H03G 3/3042; H04W 52/04; H04W 52/00; H04W 52/02; H04W 52/06; H04W 52/30; H04W 52/32; H04W 52/34; H04W 52/343; H04W 52/346; H04W 52/52; H04W 52/54; Y02B 60/50

USPC .......... 455/522, 69, 116, 115, 574, 70, 127.1, 455/127.2; 323/304; 726/17; 375/345, 259, 375/316, 297, 146, 127.3; 330/96
See application file for complete search history.

(56) References Cited

U.S. PATENT DOCUMENTS 6,011,819 A * 1/2000 Shiro ............................ 375/345
6,400,344 B1 * 6/2002 Tsunoda et al. ............... 345/60
(Continued)

FOREIGN PATENT DOCUMENTS

CN 101262258 A 9/2008
JP 60-9224 A 1/1985
(Continued)

OTHER PUBLICATIONS

Office Action mailed Jun. 17, 2014 in related Japanese application No. 2012-545797 with partial English-language translation (4 pgs.).
(Continued)

*Primary Examiner* — Tan Trinh
(74) *Attorney, Agent, or Firm* — Foley & Lardner LLP

(57) ABSTRACT

A transmission power control circuit includes: a frequency conversion unit that converts an input signal to a high frequency signal; a first power control unit that controls power of the input signal before frequency conversion by the frequency conversion unit, in a low frequency band; a second power control unit that controls power of the input signal after frequency conversion by the frequency conversion unit, in a high frequency band; and a controller that controls power using only the first power control unit in a case where a set value of output power is lower than a minimum value of output power at which power control is possible in the second power control unit, the controller controlling the power using the first power control unit and the second power control unit in a case where the set value of the output power is higher than the minimum value of the output power.

7 Claims, 6 Drawing Sheets

(56) References Cited

U.S. PATENT DOCUMENTS

| | | | |
|---|---|---|---|
| 6,788,744 B1* | 9/2004 | Hirama | 375/297 |
| 2001/0051511 A1* | 12/2001 | Kakizaki et al. | 455/116 |
| 2002/0025839 A1* | 2/2002 | Usui | 455/574 |
| 2002/0111183 A1* | 8/2002 | Lundby | 455/522 |
| 2006/0111060 A1* | 5/2006 | Kuriyama et al. | 455/127.2 |
| 2008/0059821 A1* | 3/2008 | Xiao | 713/320 |
| 2008/0108315 A1* | 5/2008 | Hamalainen | 455/127.1 |
| 2009/0075608 A1* | 3/2009 | Ichitsubo | 455/127.2 |
| 2009/0199292 A1* | 8/2009 | Sakamoto et al. | 726/17 |

FOREIGN PATENT DOCUMENTS

| | | | |
|---|---|---|---|
| JP | H06-508012 A | 9/1994 |
| JP | H09-148852 A | 6/1997 |
| JP | 10-28061 A | 1/1998 |
| JP | 1179038 A | 4/1998 |
| JP | 10-303762 A | 11/1998 |
| JP | 2005-303421 A | 10/2005 |
| JP | 2008-312045 A | 12/2008 |
| JP | 2012-010366 A | 1/2012 |

OTHER PUBLICATIONS

Office action mailed May 30, 2014 in related Chinese application No. 201180056457.9 with English-language translation (16 pgs.).
International Search Report, PCT/JP2011/077082, Jan. 17, 2012, 2 pages.

* cited by examiner

TRANSMISSION POWER CONTROL CIRCUIT AND TRANSMISSION DEVICE, TRANSMISSION POWER CONTROL METHOD, PROGRAM

TECHNICAL FIELD

The present invention relates to a transmission power control circuit and a transmission power control method, which are used in the high frequency radio communication field. The present invention relates particularly to a transmission power control circuit and a transmission device, which have a function of converting medium frequencies into transmission frequencies using a mixer, a transmission power control method, and a program.

BACKGROUND ART

Transmission power control circuits are installed in radio communication devices to maintain a constant transmission power. A transmission power control circuit typically controls such that the transmission output level is kept constant by detecting part of the transmission power by a wave detector, and adjusting the gain of an amplification circuit or an attenuator by feedback of the wave detection voltage. Such transmission power control is also disclosed in Patent Document 1, for example.

A diode used as a wave detector for detecting radio waves in the tens of GHz can only accept wave detection voltages with a dynamic range of approximately 20 to 30 dB. FIG. 7 is a diagram showing wave detection characteristics in a 38 GHz band used for fixed access communication and the like. In FIG. 7, if the range in which accurate wave detection is possible is 10 mV to 1V, the dynamic range D is limited to 26 dB.

As described above, the dynamic range in which power control is possible is often limited by a wave detector with a high frequency band. Therefore, it is difficult to meet requirements for wide transmission power ranges such as dynamic ranges of 50 dB or 80 dB. As proposals to solve such a problem, there are techniques disclosed in Patent Document 2 and Patent Document 3 for example. A transmission output control circuit disclosed in Patent Document 2 includes a wave detection circuit, a calculating amplifier, a calculating amplifier, and an automatic output control circuit. The wave detection circuit receives part of an output of a power amplification circuit, which amplifies a transmission signal. The calculating amplifier receives the output of the wave detection circuit, and can switch the gain in a plurality of steps. The automatic output control circuit receives the output of the calculating amplifier. In this transmission output control circuit, the output of the automatic output control circuit is fed back to the power amplification circuit, and the transmission output is controlled in a plurality of steps.

A transmission power control circuit disclosed in Patent Document 3 includes a signal branching unit, a switching unit, and a control unit. The signal branching unit, on the output side of a distributor for distributing part of the output of the amplifier, inputs a high harmonic signal, branches it to a plurality of high harmonic signals, attenuates them such that the branched plurality of high harmonic signals become high harmonic signals whose levels vary in steps at fixed intervals, and outputs them. The switching unit inputs the plurality of high harmonic signals output from the signal branching unit, selects one of the high harmonic signals among the input plurality of high harmonic signals according to an instruction of a switching control signal, and outputs it as a transmission output signal. The control unit outputs the switching control signal. In the transmission power control circuit, a switching control signal is output from the control unit, and a control voltage is output to change the gain of the amplifier corresponding to the switching operation of the output signal by the switching unit.

PRIOR ART DOCUMENTS

Patent Documents

[Patent Document 1] Japanese Unexamined Patent Application, First Publication No. 2008-312045
[Patent Document 2] Japanese Unexamined Patent Application, First Publication No. S60-009224
[Patent Document 3] Japanese Unexamined Patent Application, First Publication No. H10-028061

SUMMARY OF THE INVENTION

Problem to be Solved by the Invention

In the above-described transmission output control circuit disclosed in Patent Document 2, the arrangement is such that the amplification factor for amplifying the wave detection voltage of the wave detector is switched. However, since the error becomes high due to noise in regions where the wave detection voltage is low, it is not possible to control the power accurately.

In the above-described transmission power control circuit disclosed in Patent Document 3, the switching operation in the switching unit is performed by a switching control signal, and also the gain of the amplifier is changed corresponding to the switching operation of the output signal by the switching unit, to control the transmission power in a wide range. This is not suitable for a radio communication system that performs continuous communication without time division, because the signal is interrupted by the switching in the switching unit.

An exemplary object of the present invention is to provide a transmission power control circuit, a transmission device, a transmission power control method, and a program, which can solve the above-described problems.

Means for Solving the Problems

In order to achieve the above-described object, a transmission power control circuit of the present invention includes: a frequency conversion unit that converts an input signal to a high frequency signal; a first power control unit that controls power of the input signal before frequency conversion by the frequency conversion unit, in a low frequency band; a second power control unit that controls power of the input signal after frequency conversion by the frequency conversion unit, in a high frequency band; and a controller that controls power using only the first power control unit in a case where a set value of output power is lower than a minimum value of output power at which power control is possible in the second power control unit, the controller controlling the power using the first power control unit and the second power control unit in a case where the set value of the output power is higher than the minimum value of the output power.

A transmission power control method of the present invention includes: performing first power control of an input signal in a low frequency band; converting the input signal after the power control to a high frequency signal; performing second power control of the input signal after the frequency conversion in a high frequency band; and performing power control using only the first power control in a case where a set value of output power is lower than a minimum value of output power at which power control is possible in the second power control, and performing power control using the first power control and the second power control in a case where the set value of the output power is higher than the minimum value of the output power.

A transmission device for radio communication of the present invention includes: the aforementioned transmission power control circuit, and controls power by the transmission power control circuit such that power of an output signal becomes constant, and outputs the output signal.

A program of the present invention causes a computer to execute each processing of the aforementioned transmission power control method.

Effect of the Invention

In an exemplary embodiment of the present invention, power is controlled in the first power control unit within a region of the output power control where the wave detection voltage in the wave detector of the second power control unit is low, so power control is not possible in the second power control unit. By so doing, transmission power control with high accuracy is possible over a wider transmission power range. Furthermore, since it does not change amplifier gain in correspondence with a switching operation of an output signal by the switching unit, it can be used easily in a radio communication system for continuous communication.

EMBODIMENTS FOR CARRYING OUT THE INVENTION

Hereunder is a detailed description of preferred embodiments for carrying out the present invention, with reference to the drawings.

Figure 1A:
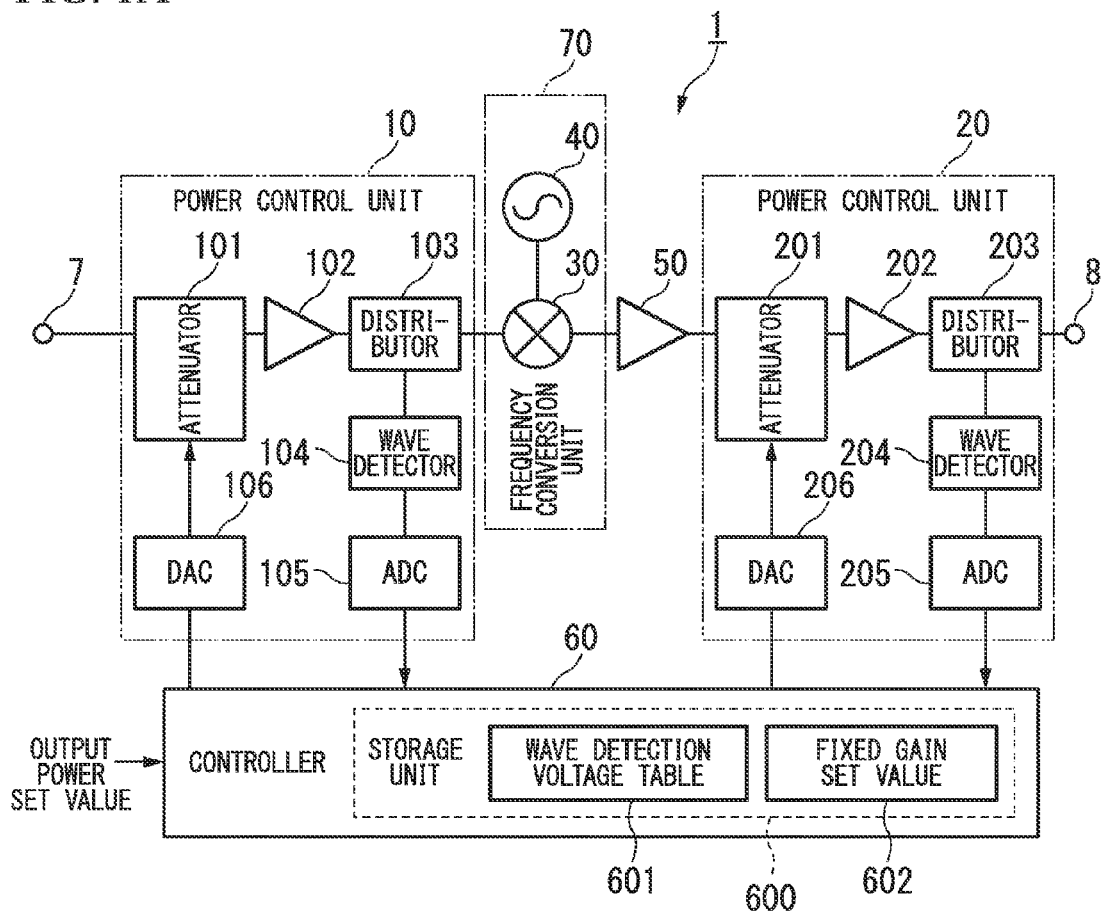
FIG. 1A is a block diagram showing the schematic structure of a transmission power control circuit according to an exemplary embodiment of the present invention.
Figure 1B:
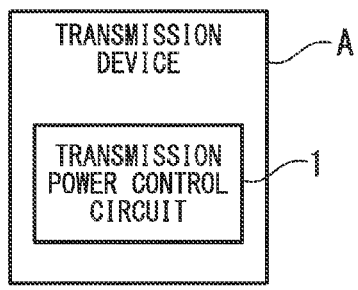
FIG. 1B is a block diagram showing the schematic structure of a transmission device including the transmission power control circuit shown in FIG. 1A.

FIG. 1A is a block diagram showing the schematic structure of a transmission power control circuit according to an exemplary embodiment of the present invention. As shown in FIG. 1B, a transmission power control circuit 1 of the present exemplary embodiment is included in a transmission device A. In FIG. 1A, the transmission power control circuit 1 includes power control units 10 and 20, a mixer 30, a local oscillator 40, an amplifier 50, and a controller 60 using a CPU (Central Processing Unit). The power control unit 10 (referred to hereunder as "first power control unit") is a front end power control unit to which a signal is input directly. The power control unit 20 (referred to hereunder as "second power control unit") is a rear end power control unit to which the output signal of the first power control unit 10 amplified after frequency conversion is input.

The first power control unit 10 controls power in the low frequency band before frequency conversion by a frequency conversion unit 70, which is described later. The first power control unit 10 includes an attenuator 101, an amplifier 102, a distributor 103, an IF (Intermediate Frequency) band wave detector 104, an ADC (Analog to Digital Converter) 105, and a DAC (Digital to Analog Converter) 106. The attenuator 101 attenuates a signal input from an input terminal 7 by the attenuation in accordance with a control value output from the DAC 106. The amplifier 102 amplifies a signal passed through the attenuator 101 to a predetermined level. The distributor 103 extracts an extremely small part of the signal output from the amplifier 102. As the distributor 103, a directional coupler is typically used. The wave detector 104 outputs a wave detection voltage proportional to the level of the extremely small part of the signal extracted by the distributor 103. The ADC 105 converts the wave detection voltage output from the wave detector 104 to digital. The DAC 106 converts the control value of the attenuator 101 generated in the controller 60 to analog. The attenuator 101 sets the attenuation amount according to the control value converted to analog by the DAC 106.

The mixer 30 mixes a signal output from the first power control unit 10 and a local oscillation signal generated by a local oscillator 40, and converts it into a signal having a higher frequency than the signal output from the first power control unit 10. The mixer 30 and the local oscillator 40 constitute a frequency conversion unit 70. The amplifier 50 amplifies a signal obtained by the mixer 30 to a predetermined level.

The second power control unit 20 controls power in the high frequency band after frequency conversion by the frequency conversion unit 70. The second power control unit 20 has the same structure as the first power control unit 10. The second power control unit 20 includes an attenuator 201, an amplifier 202, a distributor 203, an RF (Radio Frequency) band wave detector 204, an ADC 205, and a DAC 206. The attenuator 201 attenuates the signal output from the amplifier 50 by the attenuation in accordance with a control value output from the DAC 206.

The amplifier 202 amplifies a signal passed through the attenuator 201 to a predetermined level. The distributor 203 extracts an extremely small part of the signal output from the amplifier 202. As the amplifier 202, a directional coupler is used similarly to the aforementioned distributor 103 of the first power control unit 10. The distributor 203 outputs a signal to an output terminal 8. The wave detector 204 outputs a wave detection voltage proportional to the level of the extremely small part of the signal extracted by the distributor 203. The ADC 205 converts the wave detection voltage output from the wave detector 204 to digital. The DAC 206 converts the control value of the attenuator 201 generated in the controller 60 to analog. The attenuator 201 sets the attenuation amount according to the control value converted to analog by the DAC 206.

The controller 60 receives the respective wave detection voltages (digital values) of the first power control unit 10 and the second power control unit 20, and also outputs control values to set the respective attenuation amounts of the first power control unit 10 and the second power control unit 20. The controller 60 has a wave detection voltage table 601 and a fixed gain set value 602. The wave detection voltage table 601 compares the output power set value and the wave detection voltage. The fixed gain set value 602 is used to fix the gain of the second power control unit 20 when transmission power control is performed by the first power control unit 10. The wave detection voltage table 601 and the fixed gain set value 602 are stored in the storage unit 600 of the controller 60. The above-mentioned output power set value is set by a higher level device, which is not shown in the figure.

The controller 60 compares the wave detection voltage (digital value) input from the ADC 105 of the first power control unit 10 with the output power set value, and outputs to the DAC 106 a control value to set the attenuation amount of the attenuator 101 of the first power control unit 10 such that the wave detection voltage of the first power control unit 10 approaches the output power set value. Furthermore, the controller 60 compares the wave detection voltage (digital value) input from the ADC 205 of the second power control unit 20 with the output power set value, and outputs to the DAC 206 a control value that sets the attenuation amount of the attenuator 201 of the second power control unit 20 such that the wave detection voltage of the second power control unit 20 approaches the output power set value.

Figure 2:
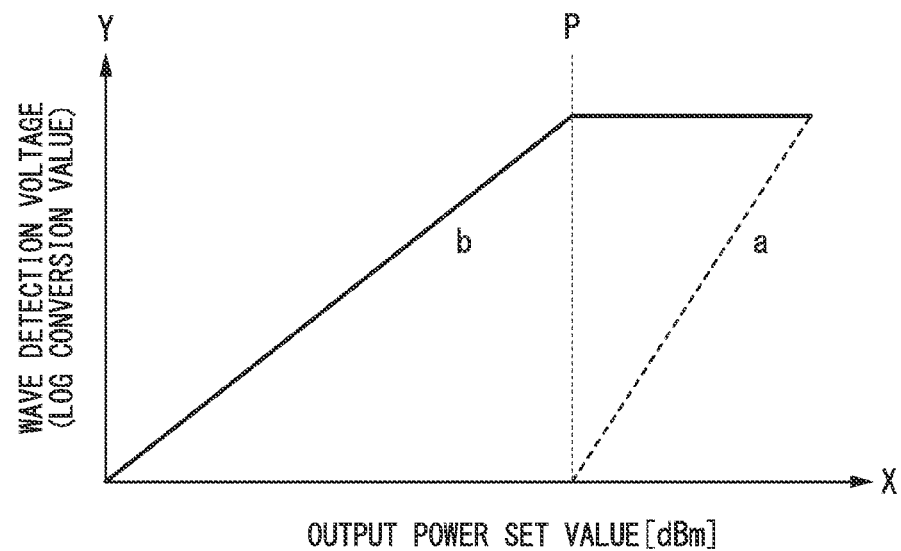
FIG. 2 is a graph showing the relationship between output power set value and wave detection voltage in the transmission power control circuit of FIG. 1A.

FIG. 2 is a diagram showing the relationship between the output power set value and the wave detection voltage. In FIG. 2, the X-axis is output power set value, and the Y-axis is a logarithmic conversion value of the wave detection voltage. In the present exemplary embodiment, it is assumed that Schottky-barrier diodes are used as the wave detectors 104 and 204, for example. Therefore, since the wave detection voltage is expressed as an exponential function with respect to input power, the wave detection voltage is converted to a logarithm.

In FIG. 2, the broken line a denotes the wave detection voltage of the wave detector 204 of the second power control unit 20. The solid line b denotes the wave detection voltage of the wave detector 104 of the first power control unit 10. Values (target values) of the wave detection voltages a and b of the output power set values are set in the wave detection voltage table 601 stored in the storage unit 600 of the controller 60.

The transmission power control circuit 1 of the present exemplary embodiment basically performs closed-loop control similarly to a typical transmission power control circuit (not shown in the figure). In the first power control unit 10, the wave detection voltage obtained by the wave detector 104 is converted to digital by the ADC 105, and the wave detection voltage converted to digital is input to the controller 60. The controller 60 compares the current wave detection voltage converted to digital with the value (target value) of the wave detection voltage table 601 associated with the current output power set value. As a result of the comparison, in the case where the current wave detection voltage is higher than the target value, the controller 60 generates a value for the attenuator 101 so as to increase the attenuation amount of the attenuator 101. On the other hand, in the case where the current wave detection voltage is lower than the target value, the controller 60 generates a control value for the attenuator 101 so as to decrease the attenuation amount of the attenuator 101.

In the second power control unit 20, the wave detection voltage obtained by the wave detector 204 is converted to digital by the ADC 205, and the wave detection voltage converted to digital is input to the controller 60. The controller 60 compares the current wave detection voltage converted to digital with the value (target value) of the wave detection voltage table 601 associated with the current output power set value. As a result of the comparison, in the case where the current wave detection voltage is higher than the target value, the controller 60 generates a control value for the attenuator 201 so as to increase the attenuation amount of the attenuator 201. On the other hand, in the case where the current wave detection voltage is lower than the target value, the controller 60 generates a control value for the attenuator 201 so as to decrease the attenuation amount of the attenuator 201.

Figure 3:
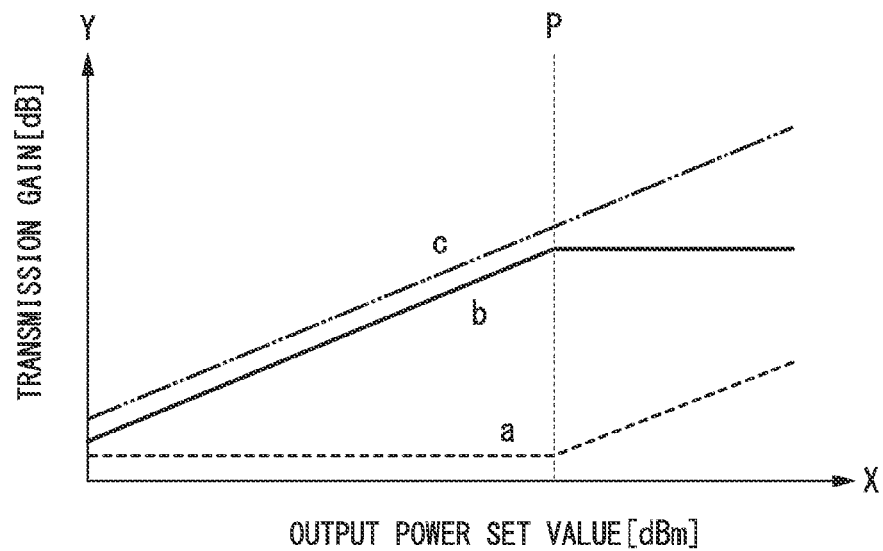
FIG. 3 is a graph showing the relationship between output power set value and transmission gain in the transmission power control circuit of FIG. 1A.
Figure 4:
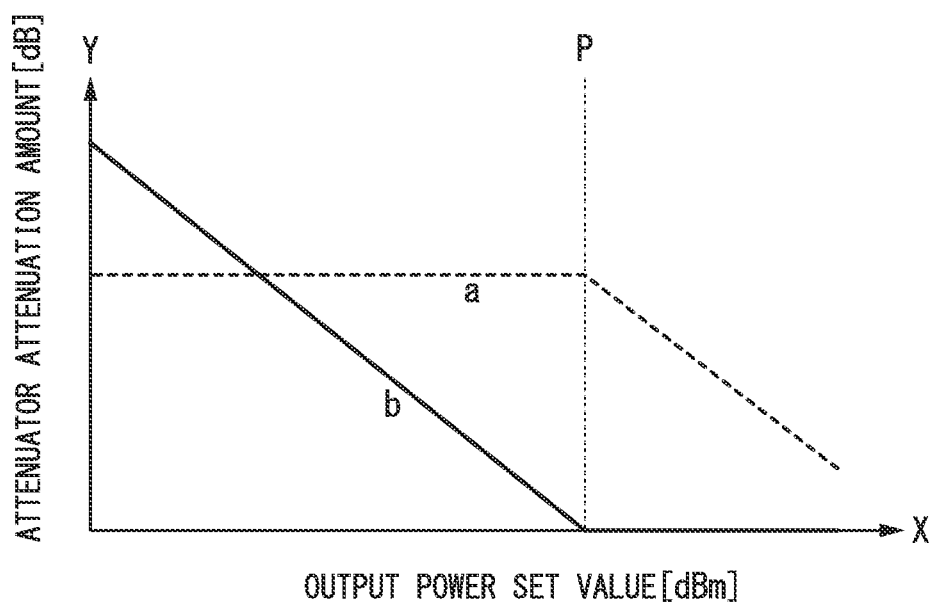
FIG. 4 is a graph showing the relationship between output power set value and attenuator attenuation amount in the transmission power control circuit of FIG. 1A.

Here is a detailed description of the control by the controller 60 with reference to FIG. 2 through FIG. 4.

FIG. 2 is a diagram showing the relationship between output power setting and wave detection voltage as described previously. FIG. 3 is a diagram showing the relationship between output power set value and transmission gain. In FIG. 3, the X-axis is output power set value, and the Y-axis is transmission gain. FIG. 4 is a diagram showing the relationship between output power set value and attenuator attenuation amount (attenuation amount to be set in the attenuators 101 and 201). In FIG. 4, the X-axis is output power set value, and the Y-axis is attenuator attenuation.

Firstly in FIG. 2, a threshold value P is the minimum value of the output power of the second power control unit 20 (minimum value of output power at which power control based on the characteristics of the wave detector 204 is possible). The threshold value P is also the minimum value in the case where transmission power control is performed by only the power control unit 20.

If the output power set value is lower than the threshold value P, the second power control unit 20 does not perform closed-loop control, but controls the attenuator 201 so as to have a constant transmission gain as shown by the broken line a of FIG. 3. Furthermore, the first power control unit 10 performs closed-loop control so as to produce a target value of the wave detection voltage corresponding to the output power set value.

On the other hand, if the output power set value is higher than the threshold value P, the first power control unit 10 performs closed-loop control so as to produce the target value (b: fixed value) of the wave detection voltage. Afterwards, the second power control unit 20 performs closed-loop control so as to produce the target value (a) of the wave detection voltage corresponding to the output power set value.

The set values of the transmission gains of the power control units 10 and 20 in the case where the above-described control is performed are shown in FIG. 3. In FIG. 3, the solid line b indicates the transmission gain of the first power control unit 10, and the broken line a indicates the transmission gain of the second power control unit 20. The two-dot chain line c (a+b) indicates the total value of the addition of the transmission gain of the first power control unit 10 and the transmission gain of the second power control unit 20. The two-dot chain line c (a+c) is a straight line with respect to the output power set value.

Figure 5:
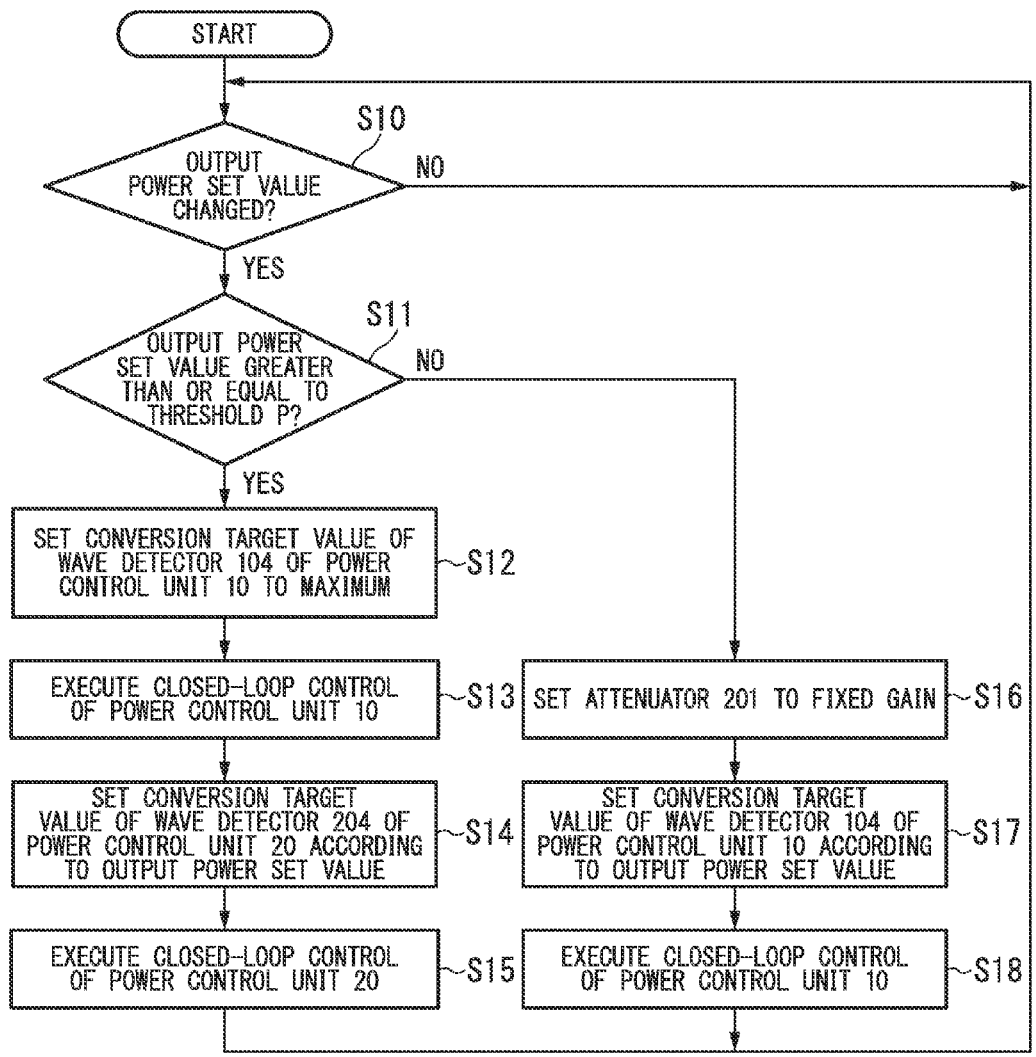
FIG. 5 is a flow chart to explain the performance of a controller in the transmission power control circuit of FIG. 1A.

FIG. 5 is a flow chart showing the operation of the controller 60. In FIG. 5, the controller 60 firstly reads the output power set value stored in a memory or the like, and determines whether or not there is a change in the output power set value (step S10). Since the output power set value is set by a higher level device, as mentioned previously, the controller 60 determines whether or not the output power set value has been changed. If the determination by the controller 60 is that there is no change in the output power set value (that is, it is determined "NO"), it repeats the determination of step S10 until the output power set value is changed. Conversely, if the controller 60 determines that there is a change in the output power set value (that is, it is determined "YES"), it determines whether the output power set value is greater than or equal to the threshold value P stored in a memory or the like (step S11). The information of the threshold value P is the value of the maximum transmission (output) power that the transmission device A included in the transmission power control circuit 1 can output by the processing of the first power control unit 10. In this determination, if the determination by the controller 60 is that the output power set value is greater than or equal to the threshold value P (that is, it is determined "YES"), it sets the convergence target value of the wave detector 104 of the first power control unit 10 to the maximum in order to start closed-loop control by the first power control unit 10 (step S12). After setting the convergence target value to the maximum, the controller 60 executes closed-loop control of the first power control unit 10 (step S13). Next, the controller 60 sets the convergence target value of the wave detector 204 according to the output power set value in order to start closed-loop control by the second power control unit 20 (step S14). After the convergence target value is set according to the output power set value, closed-loop control of the second power control unit 20 is executed (step S15).

On the other hand, in the above-described determination of step S11, if the controller 60 determines that the output power set value is less than or equal to the threshold value P (that is, it is determined "NO"), it sets the attenuator 201 of the second power control unit 20 to a fixed gain (step S16). That is, the controller 60 sets the control value based on the fixed gain set value (step S16). Next, the controller 60 sets the convergence target value of the wave detector 104 of the first power control unit 10 according to the output power set value (step S17). Afterwards, the controller 60 executes closed-loop control of the first power control unit 10 (step S18). From then on, the processing of step S10 to step S18 is repeated.

As described above, according to the transmission power control circuit 1 of the present exemplary embodiment, the first power control unit 10 controls the power in the low frequency band before frequency conversion by the frequency conversion unit 70. Furthermore, the second power control unit 20 controls the power in the high frequency band after frequency conversion by the frequency conversion unit 70. At this time, the controller 60 compares the output power set values and respective wave detection voltages of the power control units 10 and 20, and controls the power in the power control units 10 and 20 such that the wave detection voltage in the second power control unit 20 reaches the wave detection voltage target value corresponding to the output power set value. In this power control, the controller 60 controls the power in the first power control unit 10 in a region where the output power set value is low, that is, within a region of the output power control in which the wave detection voltage in the wave detector 204 of the second power control unit 20 is low, where power control is not possible. By so doing, transmission power control with high accuracy is possible over a wider transmission power range. Moreover, the gain of the amplifier does not change corresponding to a switching operation of the switch. Accordingly, it can also be used in a radio communication system that performs continuous communication.

If the dynamic range of the wave detector 104 of the first power control unit 10 is 50 dB, and the dynamic range of the wave detector 204 of the second power control unit 20 is 26 dB, the dynamic range of the transmission power becomes 76 dB. Therefore, it is a 50 dB increase in the dynamic range. In the present exemplary embodiment, the first power control unit 10, which controls power at low frequency, and the second power control unit 20, which controls power at high frequency, are provided in the front end and the rear end of the frequency conversion unit 70 respectively. In the first power control unit 10, it is possible to increase the power value of a signal input to the power value range that the second power control unit 20 can detect. As a result, a signal of a power value that cannot be detected is not input to the second power control unit 20. Consequently an input signal can be detected accurately. As a result, it is possible to output a signal with a desired power value from the transmission power control circuit 1 as a whole. Furthermore, if the frequency of the first power control unit 10 is less than 3 GHz, a wave detector with a dynamic range of greater than or equal to 50 dB can be obtained at low cost, so that it is possible to reduce the cost of realizing the transmission power control circuit 1 accordingly.

Figure 6:
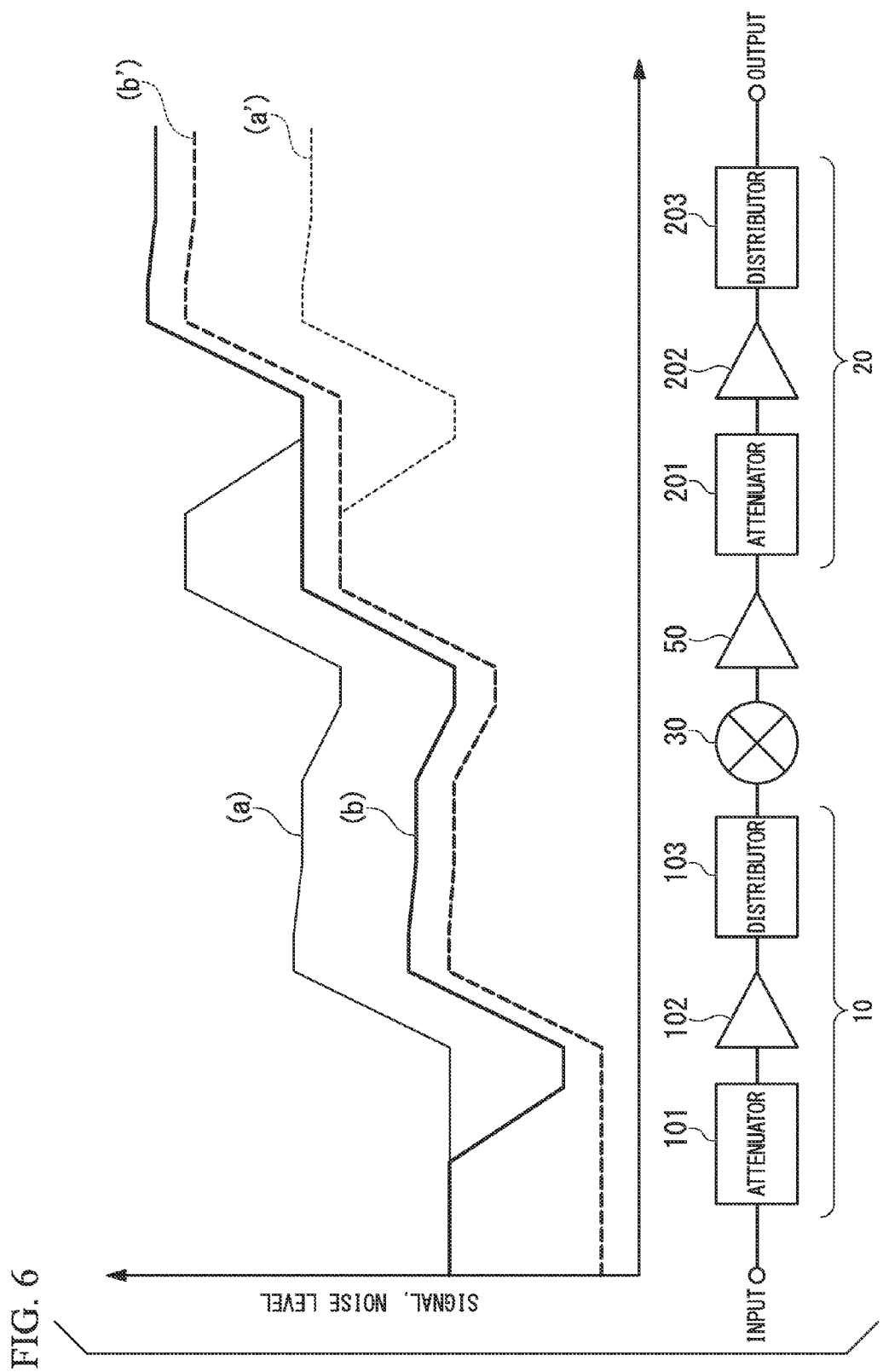
FIG. 6 is a diagram showing the relationship between the main signal and noise in the exemplary embodiment of the present invention.
Figure 7:
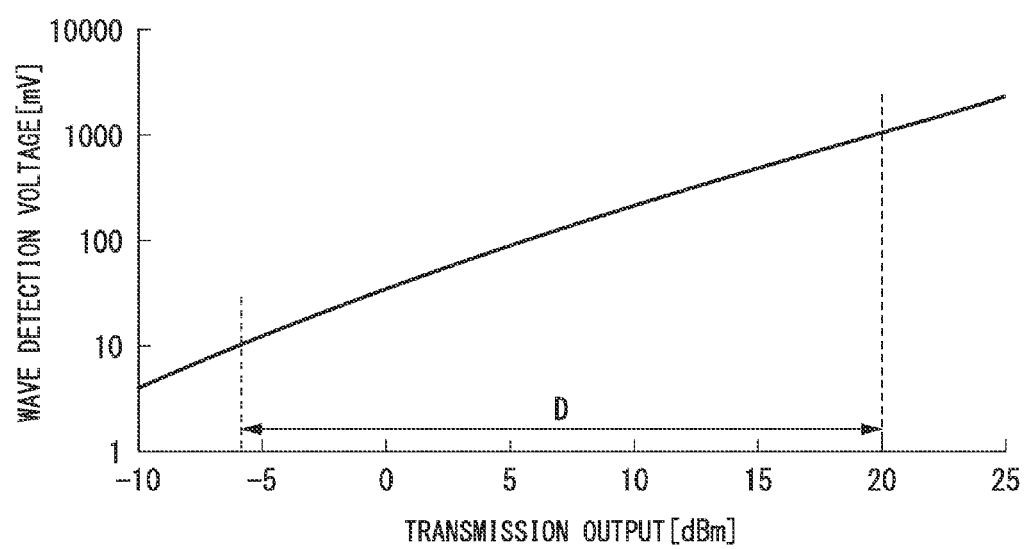
FIG. 7 is a diagram showing wave detection characteristics in a 38 GHz band used for fixed access communication and the like in related art.

FIG. 6 is a diagram showing the relationship between the main signal and noise.

In the above description, if the transmission power level (output power set value) of the transmission device A included in the transmission power control circuit 1 is lower than the threshold value P, power is controlled in the power control unit 20 such that the output power of the second power control unit 20 becomes a constant value (for example, a constant minimum value). On the other hand, regarding the first power control unit 10, power is controlled in the first power control unit 10 so as to obtain the wave detection voltage target value corresponding to the output power set value (alternatively, power may be controlled in the first power control unit 10 so as to obtain the wave detection voltage target value corresponding to the power value given by subtracting the output power value of the second power control unit 20 from the output power set value). The main signal at this time is denoted by the solid line (a) of FIG. 6, and noise (signal leakage from a mixer, and the like) is denoted by the broken line (a').

In the above description, if the transmission power level (output power set value) of the transmission device A included in the transmission power control circuit 1 is higher than the threshold value P, power is controlled in the front end power control unit 10 so as to obtain the wave detection voltage target value, which is a fixed value. Afterwards, power is controlled in the second power control unit 20 so as to obtain the wave detection voltage target value corresponding to the output power set value. The main signal at this time is denoted by the solid line (b) of FIG. 6, and noise (signal leakage from a mixer and the like) is denoted by the broken line (b').

As shown in FIG. 6, if the transmission power level (output power set value) of the transmission device A included in the transmission power control circuit 1 is lower than the threshold value P, power is controlled in the power control unit 20 such that the output power of the second power control unit 20 becomes a constant value. On the other hand, regarding the first power control unit 10, power is controlled in the first power control unit 10 so as to obtain the wave detection voltage target value corresponding to the output power set value. As a result, the S/N ratio during control in the case where the transmission power level (output power set value) of the transmission device A included in the transmission power control circuit 1 is lower than the threshold value P can be improved over control in the case where it is higher than the threshold value P.

Furthermore, when the transmission power level of the transmission device A included in the transmission power control circuit 1 is lower than the threshold value P, power is controlled in the power control unit 20 such that the output power of the second power control unit 20 becomes a constant value. On the other hand, regarding the first power control unit 10, power is controlled in the first power control unit 10 so as to obtain the wave detection voltage target value corresponding to the output power set value. However, without performing such control, if control is performed as when the transmission level (output power set value) of the transmission device A included in the transmission power control circuit 1 is higher than the threshold value P, wave detection control cannot be performed. That is, as is evident from the relationship between the main signal (b) and the noise (b'), since the attenuation amount in the front end is great, and the signal leakage from the mixer 30 is comparatively high, the power of a main signal cannot be increased significantly compared with the power of the signal leakage from an oscillator. As a result, wave detection control cannot be performed by the rear end wave detector 204. Accordingly, when the transmission power level of the transmission device A included in the transmission power control circuit 1 is lower than the threshold value P, power is controlled in the power control unit 20 such that the output power of the second power control unit 20 becomes a constant value. On the other hand, regarding the first power control unit 10, power is controlled in the first power control unit 10 so as to obtain the wave detection voltage target value corresponding to the output power set value. By so doing, it is possible to solve a problem in that wave detection control cannot be performed by the rear end wave detector 204.

Moreover, according to the abovementioned structure, in a circuit of a transmission device with an output frequency in the tens of GHZ, an IF band wave detector is used in the power control unit 10. Accordingly, when the power value is low, the IF band wave detector 104 detects the power value in the power control unit 10. Furthermore, when the power value is high, the RF band wave detector 204 on the power control unit 20 side can detect the power. Accordingly, it is possible for the dynamic range of the power value of an input signal to be increased.

Moreover, for example, in the case where the construction is such that a plurality of power control units provided in parallel in the circuits are switched to the appropriate power control unit according to the output power, the signal is interrupted by the switching, so it is not suitable for continuous communication. However, by using a construction in which a first power control unit 10 and a second power control unit 20 are provided in the front end and the rear end of the frequency conversion unit 70 as in the present exemplary embodiment, a plurality of circuits does not need to be switched using a selector switch, so the signal is not interrupted. By so doing, it is possible to construct a transmission power control circuit that can be used for continuous communication.

In the transmission power control circuit 1 of the present exemplary embodiment, transmission power is controlled by adjusting the attenuation amounts of the attenuators 101 and 201. However, this is not a limitation. Transmission power can also be controlled by adjusting the gains of the amplifiers 102 and 202.

In the transmission power control circuit 1 of the present exemplary embodiment, power s controlled by comparing the wave detection voltage and the output power set value digitally using the ADCs 105 and 205, the CPU forming the controller 60, and the DACs 106 and 206, and setting the attenuation. However, this is not a limitation. Similar performance can also be obtained by analog control using a calculating amplifier (operational amplifier) or the like to adjust the attenuation amount set in the attenuators 101 and 201.

In the transmission power control circuit 1 of the present exemplary embodiment, the transmission power control method according to the exemplary embodiment of the present invention can be executed on a computer using a program for realizing the processing of the flow chart shown in FIG. 5. The transmission power control method according to the exemplary embodiment of the present invention may be executed on a computer by storing this program in a computer readable recording medium, and having the program stored in this recording medium read by a computer system. "Computer system" here includes an OS and hardware such as peripheral devices.

"Computer system" also includes a web-based environment (or display environment) if a WWW system is used.

"Computer readable recording medium" is a portable medium such as a flexible disc, a magneto-optical disc, a ROM, a CD-ROM or the like, or a storage device such as a hard disc built-in to a computer system. "Computer readable recording medium" also includes one holding a program actively for a short time, such as a communication line in the case where a program is transmitted via a network such as the Internet or a communication circuit such as a telephone line, and one holding a program for a fixed time, such as a volatile memory inside the computer system, being a server or a client in that case. The above-described program may be one that realizes part of the aforementioned function, and furthermore, may be one that can realize the aforementioned function by a combination of programs already stored in the computer system.

This application is based upon and claims the benefit of priority from Japanese patent application No. 2010-263438 filed Nov. 26, 2010, the disclosure of which is incorporated herein in its entirety by reference.

INDUSTRIAL APPLICABILITY

The present invention is applicable to a transmission device in the microwave and millimeter wave bands, and to a radio communication device.

REFERENCE SYMBOLS

1 Transmission power control circuit
10, 20 Power control unit
30 Mixer
40 Local oscillator
50 Amplifier
60 Controller
70 Frequency conversion unit
101, 201 Attenuator
102, 202 Amplifier
103, 203 Distributor
104, 204 Wave detector
105, 205 ADC
106, 206 DAC
600 Storage unit
601 Wave detection voltage table
602 Fixed gain set value

The invention claimed is:
1. A transmission power control circuit comprising:
a frequency conversion unit that converts an input signal to a high frequency signal;
a first power control unit that controls power of the input signal before frequency conversion by the frequency conversion unit, in a low frequency band;

a second power control unit that controls power of the input signal after frequency conversion by the frequency conversion unit, in a high frequency band; and a controller that controls power using only the first power control unit in a case where a set value of output power is lower than a minimum value of output power at which power control is possible in the second power control unit, the controller controlling the power using the first power control unit and the second power control unit in a case where the set value of the output power is higher than the minimum value of the output power, wherein:

the first power control unit includes a first wave detector, the first wave detector detects part of the input signal, and outputs a first wave detection voltage to the controller, the second power control unit includes a second wave detector, the second wave detector detects part of the input signal, and outputs a second wave detection voltage to the controller, and the controller controls power in each of the first power control unit and the second power control unit such that the second wave detection voltage becomes a wave detection voltage target value corresponding to the set value of the output power.

2. The transmission power control circuit according to claim 1, wherein the minimum value of the output power at which power control is possible in the second power control unit is a minimum value of output power at which power control is possible by the wave detection voltage of the second wave detector of the second power control unit, the controller controls power in the second power control unit such that output power of the second power control unit is a constant value and controls power in the first power control unit so as to obtain the wave detection voltage target value corresponding to the set value of the output power, in a case where the set value of the output power is lower than the minimum value, and the controller controls power in the first power control unit so as to obtain the wave detection voltage target value being a fixed value and then controls power in the second power control unit so as to obtain the wave detection voltage target value corresponding to the set value of the output power, in a case where the set value of the output power is higher than the minimum value.

3. The transmission power control circuit according to claim 1, further comprising:

a storage unit that stores a wave detection voltage table including a correspondence table of various set values of output power and target values of wave detection voltages corresponding to the respective set values of the output power, wherein the controller compares a current set value of output power and a wave detection voltage target value corresponding to the set value of the output power in the wave detection voltage table, upon obtaining wave detection voltages from the wave detectors of each of the first power control unit and the second power control unit, the controller controls power such that output power of each of the first power control unit and the second power control unit decreases, in a case where a current wave detection voltage is higher than the wave detection voltage target value, and the controller controls power such that output power of each of the first power control unit and the second power control unit increases, in a case where the current wave detection voltage is lower than the wave detection voltage target value.

4. The transmission power control circuit according to claim 1, wherein each of the first power control unit and the second power control unit includes an attenuator that attenuates an input signal, the controller sets a control value of each of the attenuators such that attenuation amount of the attenuator of each of the first power control unit and the second power control unit increases, in a case where a current wave detection voltage is higher than the wave detection voltage target value, and the controller sets a control value of each of the attenuators such that attenuation amount of the attenuator of each of the first power control unit and the second power control unit decreases, in a case where the current wave detection voltage is lower than the wave detection voltage target value.

5. The transmission power control circuit according to claim 4, comprising:

a storage unit that stores fixed gain set value for setting a transmission gain in the second power control unit to a constant value, the controller setting the attenuator of the second power control unit to a control value based on the fixed gain set value, in a case where the set value of the output power is lower than the minimum value.

6. A transmission device for radio communication, comprising:

the transmission power control circuit according to claim 1, wherein the transmission device controls power by the transmission power control circuit such that power of an output signal becomes constant, and outputs the output signal.

7. A transmission power control method comprising:

performing first power control of an input signal in a low frequency band;

converting the input signal after the power control to a high frequency signal;

performing second power control of the input signal after the frequency conversion in a high frequency band; and performing power control using only the first power control in a case where a set value of out is lower than a minimum value of output power at which power control is possible in the second power control, and performing power control using the first power control and the second power control in a case where the set value of the output power is higher than the minimum value of the output power, wherein:

the first power control detects part of an input signal, and outputs a first wave detection voltage, the second power control detects part of an input signal, and outputs a second wave detection voltage, and power control is performed in each of the first power control and the second power control such that the second wave detection voltage becomes a wave detection voltage target value corresponding to the set value of the output power.

* * * * *